(12) United States Patent
Fortune

(10) Patent No.: US 7,848,254 B2
(45) Date of Patent: Dec. 7, 2010

(54) METHODS AND APPARATUS FOR DETERMINING EQUIVALENCE AND GENERALIZATION OF A NETWORK MODEL

(75) Inventor: Steven J. Fortune, Summit, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 895 days.

(21) Appl. No.: 11/281,642

(22) Filed: Nov. 17, 2005

(65) Prior Publication Data

US 2007/0112551 A1 May 17, 2007

(51) Int. Cl.
*H04L 12/28* (2006.01)
(52) U.S. Cl. ..................................... 370/254
(58) Field of Classification Search ............... 715/700, 715/764, 771; 370/299, 235, 236
See application file for complete search history.

(56) References Cited

U.S. PATENT DOCUMENTS 7,289,456 B2 * 10/2007 Gupta et al. ............... 370/254
2003/0069960 A1 * 4/2003 Symons et al. ............. 709/224
2003/0217041 A1 * 11/2003 Mao ............................. 707/1
2006/0023639 A1 * 2/2006 Bohannon et al. .......... 370/254
2007/0061144 A1 * 3/2007 Grichnik et al. .......... 704/256.8
2007/0106485 A9 * 5/2007 Seger .......................... 702/189

OTHER PUBLICATIONS

U.S. Appl. No. 10/900,561, filed Jul. 28, 2004.

* cited by examiner

*Primary Examiner*—Chi H Pham
*Assistant Examiner*—Fan Ng
(74) *Attorney, Agent, or Firm*—Ryan, Mason & Lewis, LLP

(57) ABSTRACT

Methods and apparatus are provided for determining equivalence and generalization of a network model. A method is provided for determining whether two networks are equivalent. A model of at least two networks is obtained, and then simplified using one or more normal form rules. A test is then performed to determine if the two simplified network models are equivalent (e.g., isomorphic). A first network M is said to be generalized by a second network N, M≦N, if every test that satisfies M also satisfies N. A first network M is said to be equivalent to a second network N, N≡M, if M generalizes N and N generalizes M.

20 Claims, 6 Drawing Sheets

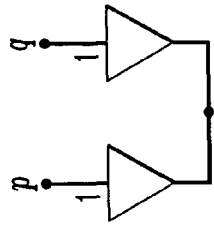
FIG. 3A
FIG. 3B
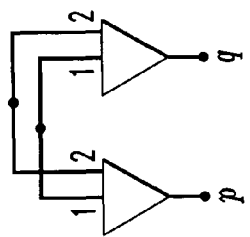
FIG. 3C
FIG. 3D
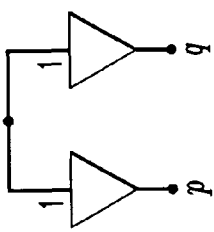
FIG. 3E
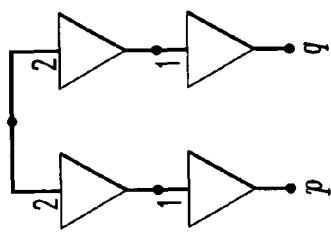
FIG. 4

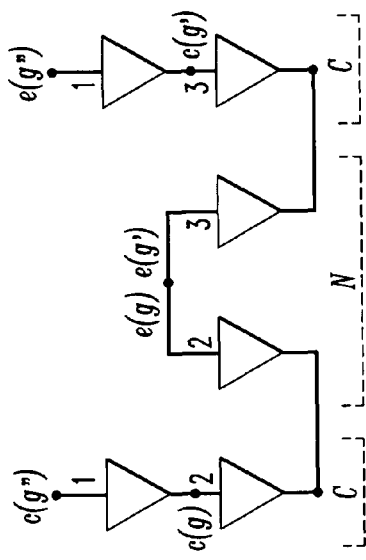
*FIG. 5C*
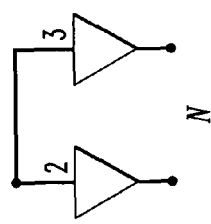
*FIG. 5B*
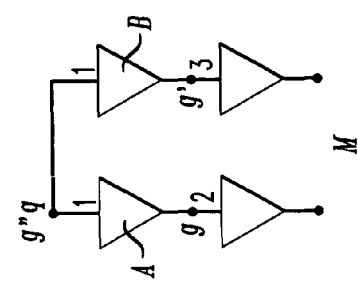
*FIG. 5A*
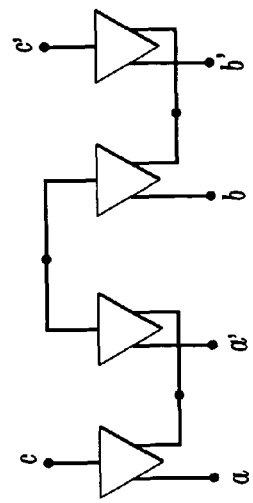
*FIG. 6D*
*FIG. 6C*
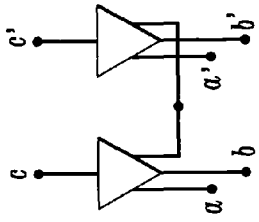
*FIG. 6B*
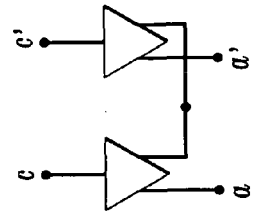
*FIG. 6A*

METHODS AND APPARATUS FOR DETERMINING EQUIVALENCE AND GENERALIZATION OF A NETWORK MODEL

FIELD OF THE INVENTION

This invention relates generally to techniques for modeling a network and, more particularly, to techniques for determining equivalence and generalization of network models.

BACKGROUND OF THE INVENTION

A telecommunications network is often modeled as a graph, with a vertex representing a network element physical location, and an edge representing a link over which data can be transmitted. This simple model does not capture the complex layered nature of many networks, where a logical link used by one technological level is provided as a service by a different level.

U.S. patent application Ser. No. 10/900,561, filed Jul. 28, 2004, entitled "System and Method for Verifying a Description of a Network," incorporated by reference herein discloses a network model that explicitly captures the layered nature of networks. The disclosed model is based on the concepts of layering and adaptation. A layer is a particular encoding of a stream of data. Adaptation is the conversion between layers. Adaptation models both encapsulation and multiplexing. An instance of the model includes links that transmit data and adapters that perform adaptation.

The disclosed model can be applied uniformly and simultaneously to many network technologies, such as Synchronous Optical Network (SONET), Asynchronous Transfer Mode (ATM), Dense Wavelength Division Multiplexing (DWDM) and Multi Protocol Label Switching (MPLS). An instance of the model represents the flow of data through a network, where communication at one layer may depend upon links at a different layer. The model forms the conceptual basis of NetML, an XML-based network interchange language. NetML can be used to implement many standard network analysis algorithms, such as circuit tracing, shared protection analysis, reliability estimation and fault analysis, in a way that is independent of technology.

While NetML effectively allows most types of networks to be modeled, it does not provide a mechanism for automatically comparing two different network models. In particular, NetML does not provide techniques for determining equivalence and generalization of network models. Thus, a need exists for methods and apparatus for determining equivalence or generalization (or both) of network models.

SUMMARY OF THE INVENTION

Generally, methods and apparatus are provided for determining equivalence and generalization of a network model. According to one aspect of the invention, a method is provided for determining whether two networks are equivalent. A model of at least two networks is obtained, and then simplified using one or more normal form rules. A test is then performed to determine if the two simplified network models are equivalent. For example, the test may determine if the two simplified network models are isomorphic. The network model can be generated, for example, using NetML.

As used herein, a first network M is said to be generalized by a second network N, $M \leq N$, if every test that satisfies M also satisfies N. A first network M is said to be equivalent to a second network N, $N \equiv M$, if M generalizes N and N generalizes M.

In the situation of a network having "reverse multiplexing," the equivalence test further comprises the steps of forming the basic tests of M; determine if each basic test of M is satisfied by N; repeating the forming and determining steps with the roles of M and N reversed; and determining that networks M and N are equivalent if all basic tests are satisfied.

A number of normal form rules are disclosed for simplifying the network model. For example, if one of the obtained network models, M, contains a link l with ports p and q, at least one of which is not public, then one or more of the normal form rules delete a link if $p \cdot p'$ and $q \cdot q'$, the connections to p and q are then deleted and the connection $p' \cdot q'$ is added. According to another normal form rule, at least one of the obtained network models, M, contains a pair of adapters A and B with connected host ports, and wherein the one or more normal form rules delete adapters A and B. Additional normal form rules delete a port p that is free and not public, or delete a link p that is an end port of a link, or is isolated and not public.

A more complete understanding of the present invention, as well as further features and advantages of the present invention, will be obtained by reference to the following detailed description and drawings.

BRIEF DESCRIPTION OF THE DRAWINGS

FIGS. 3A through 3E each illustrate a number of modeled network components;

FIG. 4 illustrates an example of $M_{o\sigma} C$;

FIGS. 5A through 5C each illustrate a number of modeled network components;

FIGS. 6A through 6D illustrates examples of modeled network components having reverse multiplexing;

DETAILED DESCRIPTION

The present invention provides methods and apparatus for determining equivalence and generalization of network models. As used herein, two networks M and N with the same public ports are (externally) equivalent if for any other network Q, two ports in the composition M o Q communicate exactly if they communicate in N o Q. M is said to generalize N if whenever two ports communicate in N o Q, the ports also communicate in M o Q.

According to one aspect of the invention, if the adaptation is "simple," i.e., one or more data streams can be adapted into only a single data stream, then two networks are equivalent exactly if their normal forms, appropriately defined, are isomorphic. An immediate consequence is a linear time algorithm for equivalence. An extension yields a syntactic test and linear time algorithm for generalization as well. If the adaptation models "reverse multiplexing," i.e., one or more data streams can be converted into more than one data stream, isomorphism of normal forms is sufficient but not necessary for equivalence; however, a quadratic-time algorithm is disclosed for equivalence and generalization based on a notion of "black-box" testing.

The Model

Figure 1:
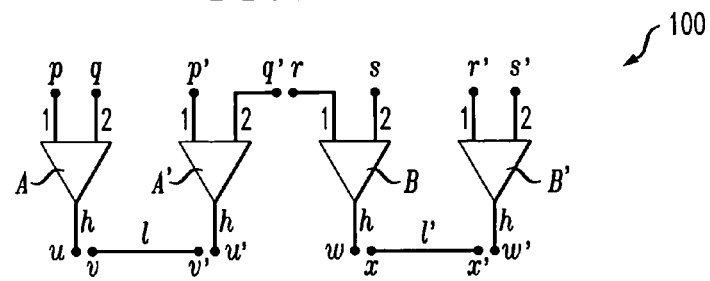
FIG. 1 illustrates a number of components in a network modeled in accordance with NetML.

FIG. 1 illustrates a number of components in a network 100 modeled in accordance with NetML. As shown in FIG. 1, the exemplary modeled network components include adapters A, A', B, and B'; links l, l'; guest labels 1, 2; and host label h. As discussed further below, guest ports, such as guest ports p, q, are on the top flat side of the adapters; host ports (u, u', w, w', all with label h) are on the bottom pointed side of the adapters. Ports v, v' are end ports of link l. Connections (e.g., u·v, q'·r) are shown in FIG. 1 by physical proximity of ports. Ports v and v' communicate, in one step, as do p and p', q and q'. Ports q and r' communicate in two steps. Ports p and q' do not communicate.

A link represents the ability to transmit data from one place to another. A link has two endpoint ports, which are access points to the stream of data flowing on the link. Data injected into one port traverses the link and is ejected from the other port. A link is bidirectional, so data injected into the second port will be ejected from the first port. A link is shown in FIG. 1 as a line segment, with a port drawn as a dot.

Ports and links are assigned a layer. A layer is essentially a type, and represents the relevant set of information required to describe the data stream, possibly including bandwidth, bit encoding scheme, error correcting codes and header information. A link and its end ports always have the same layer.

Adaptation converts between layers. Adaptation represents both encapsulation, the encoding of one data stream within another, for example, by adding extra header information, and multiplexing, where several data streams are combined into a single stream. An adapter performs adaptation. An adapter has a labeled set of guest ports and a labeled set of host ports, with layers and labels determined by the type of adapter. An adapter is drawn as a triangle pointing down, with guest ports at the bottom and host ports at the top.

Consider an adapter with a single guest port and a single host port. Any data stream of the appropriate layer can be injected into the guest port, where it is adapted to the layer of the host port and then ejected. If the resulting data stream is injected into the host port of another adapter of the same type, it is reconverted to the original layer and ejected from the guest port.

Like links, adapters are bidirectional. However, there is an asymmetry between guest and host ports: an arbitrary data stream of the appropriate layer can be injected into a guest port, and it will be adapted and ejected from the host port. However, the only data stream it is sensible to inject into a host port is one that results from a previous adaptation of the same type.

An adapter with multiple guest ports and a single host port models multiplexing. Several data streams can be injected into the guest ports of such an adapter; they are combined together and ejected from the host port. If the data stream is subsequently injected into the host port of an adapter of the same type, the individual streams are demultiplexed and ejected from the guest ports. The labels on guest ports serve to identify the individual data streams, so a data stream if injected into the host port with label 1 of the first adapter will be ejected from the host port labeled 1 of the second adapter. The label can model, for example, a time slot (in time-division multiplexing), a wavelength (in wavelength-division multiplexing), or a channel identifier (ATM).

An adapter with a single host port and several guest ports models reverse multiplexing: an arbitrary data stream can be split into several data streams. Unadaptation of reverse multiplexing recombines the data stream into a single stream. Reverse multiplexing is relatively rare, but occasionally a single high-bandwidth data stream is split into several low-bandwidth streams for transport.

A network signature describes the layers and adapter types allowed in the network; every network has an associated signature. In the NetML model, a layer is abstract and is not decomposed in any way. All information layers are defined by the set of adapter types, which specifies the set of possible adaptations between layers.

Two ports of the same layer can be connected together. Informally, data ejected from one port is injected into the other. A port can be connected to exactly one other port; a port that is not connected is a free port. A network is built from links and adapters by connecting ports together. In FIG. 1, connections are depicted by proximity of ports. In all subsequent figures, two connected ports are shown drawn on top of each other.

A central notion for networks is communication. Two ports communicate if they behave like the end ports of a link, i.e., a data stream injected in one port is eventually ejected from the other port. Somewhat more formally, two ports communicate if there is a path through the network using links, adapters and connections which every adaptation is balanced with a corresponding unadaptation of the same type. In FIG. 1, ports v and v' communicate, ports q and r' communicate, but ports p and q' do not communicate.

An instance of the network model describes a snapshot of the configured state of a telecommunication network, in particular, the flow of data streams through the network. A typical Sonet network element, an add-drop multiplexer, has two "high-speed" OC48 ports, "east" and "west", and potentially a variety of "low-speed" ports, say at OC3 and STS1. The network element can be configured to demultiplex the incoming OC48 stream from the east port into lower bandwidth stream, and either route the substreams to low-speed ports or to be remultiplexed and sent out on the west port. For this technology, data flow is usually symmetric, so for any substream demultiplexed from the east port to a low-speed port there is a stream in the opposite direction multiplexed from the low-speed port to the east port; the west port is symmetric in the same way.

Figure 2A:
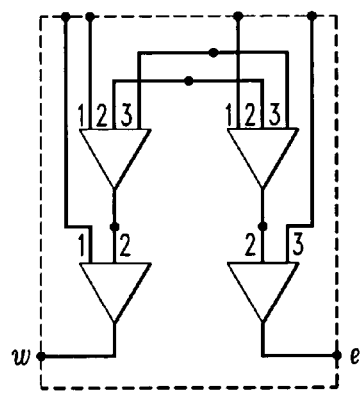
FIGS. 2A and 2B illustrate a number of modeled network components.
Figure 2B:
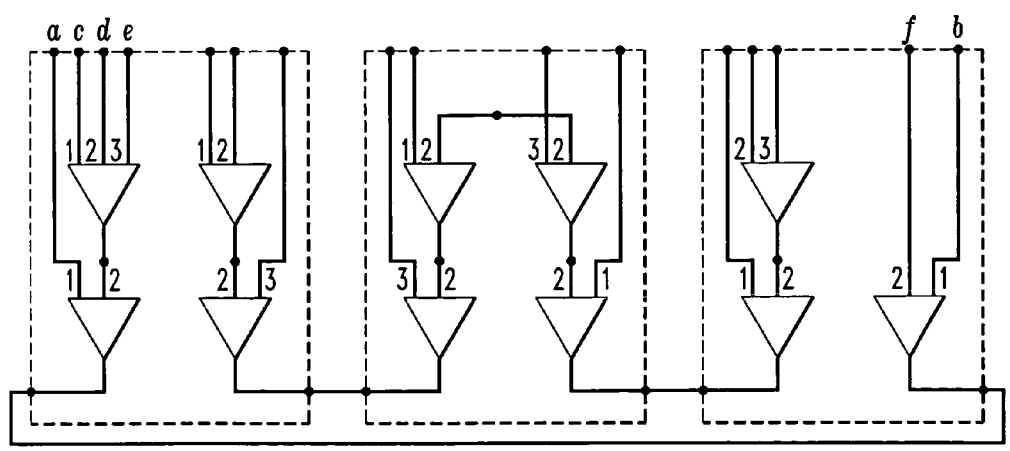

In this case, the network signature would consist of three layers, STS1, OC3, and OC48, and two adaptation types, a three-one multiplexing of STS1 into OC3, and an eight-one multiplexing of OC3 into OC48. With these layers and adaptation types, an add-drop multiplexer could be modeled as shown in FIG. 2. FIGS. 2A and 2B illustrate a number of network components modeled in accordance with NetML. FIG. 2A, for example, depicts a simple SONET ring, where for example low-speed ports a and b communicate. The dotted boxes in FIG. 2 outline aggregation of adapters into network elements, in particular Sonet add-drop multiplexers. The ports at the top of each box are "low-speed" ports; the ports at the bottom are "high-speed" ports.

It is noted that the dashed box is not part of the formal model described herein, but depicts the logical grouping of adapters that represent the network element. In this case, the add-drop multiplexer is configured so that the data stream from the east port is demultiplexed into OC3 streams, one of which is routed to a low-speed port. Another OC3 stream is further demultiplexed into STS1 streams, one of which is routed to a low-speed port, and the others are remultiplexed into the west port. In general, there could be eight OC3 guest ports; although not all are shown in FIG. 2. The labels on adapter guest ports correspond to 'time slots' within a SONET data stream. The description of a complete network can be synthesized out of the descriptions of individual network elements and links. FIG. 2A depicts a simple SONET ring, where for example low-speed ports a and b communicate.

By choosing layers and adaptation types appropriately, many different network technologies can be modeled. For example, optical wavelength-division multiplexing can be modeled with layers representing optical fiber and client data streams (such as OC48, OC192 or OC768) and adaptation types that represent the multiplexing of different client streams onto the fiber. In this case, the adapter guest port labels represent the particular wavelength used by a client data stream. ATM and MPLS are similar; for example with ATM the test port labeling can represent virtual channel index and virtual path index. The model as described here is most appropriate for "connection-oriented" technologies. An extended model, which allows more than two ports to be connected together, handles "connection-less" technologies such as IP, and in fact uniformly models interconversion between connection-oriented and connectionless technologies.

The network model can be the basis for many network analysis tasks. For example, given that two ports communicate, it may be of interest to estimate the reliability of communication. With the model, it is possible to trace the communication path through its constituent network elements and links, and then to form an aggregate reliability estimate from individual reliability estimates. The network model could also be used for a wide variety of other network analysis tasks, e.g., determining link utilization, summarizing traffic properties, planning circuit rearrangements, root-cause alarm analysis or reporting of recent changes.

The external behavior of a network is determined by a set distinguished "public" ports; a public port must be free. In FIG. 2B, the low-speed ports may all be defined as public ports, and the external interface of the Sonet ring may be defined. For any given pair of public ports, there may be no relation between the ports or the two ports may communicate, in which case the behavior of the two ports is indistinguishable from a link. However, there may also be a potentially complex set adaptations and unadaptations relating the two ports. For example, in FIG. 2B, ports c and f are related but do not communicate. Since there is no a priori way to describe the adaptations and unadaptations, and since communication is believed to be the fundamental notion, equivalence and generalization are defined in terms of composition and communication.

The composition M o$\sigma$N of two networks is the network obtained by connecting some of the public ports of M and N, where $\sigma$ specifies the connections. Suppose networks M and N have the same (or corresponding) public ports. M and N are externally equivalent, M≡N, if for every network Q, every $\sigma$, ports p and q communicate in M o$\sigma$Q if and only if they communicate in No$_\sigma$Q. M generalizes N, N≦M, if whenever two ports communicate in No$_\sigma$Q, they also communicate in Mo$_\sigma$E. FIGS. 3A through 3E illustrate a number of components in networks 300-1 through 300-5, respectively, modeled in accordance with NetML. FIGS. 3A through 3E each illustrate a number of modeled network components. In FIG. 3 and subsequent figures, connected ports are superimposed. Host port labels are omitted. In each of FIGS. 3A through 3E, ports p and q are public and are the only free ports. In FIG. 3, A≦B≦C≦D≦D=E.

First, consider networks with simple adaptation, that is, any adapter has only a single host port. Then, two networks M and N with the same public ports are equivalent exactly if their normal forms, appropriately defined, are isomorphic. An immediate consequence is that there is a test for equivalence that runs in time linear in the sum of the sizes of M and N. A variant of this result gives a syntactic condition on normal forms that holds exactly if one network generalizes the other; again a linear time algorithm can test generalization.

A network instance can have adapters with several host ports; this models so-called reverse adaptation, where a single high-bandwidth data stream can be split into several lower-bandwidth data streams for transport. In this case, isomorphism of normal forms certainly implies equivalence of the original networks, but the converse is not true. Nonetheless, there is a quadratic algorithm for testing whether one network generalizes another, and hence of testing whether two networks are equivalent.

A final result concerns a protection-switching variant, which can model the routing of communication over two disjoint paths, or more generally the routing of k communicating pairs over l>k paths. In this case, it turns out that equivalence is co-NP-complete, using a reduction from testing equivalence of monotone Boolean circuits.

Basic Properties of the Model

Formal Definition of Networks A network signature (L, T) consists of a set L of layers and a set T of adapter types. An adapter type (G, H, l) consists of disjoint nonempty sets G and H of guest labels and host labels, respectively, and a layer function l: G ∪ H → L. The sets l(G) and l(H) are the guest layers and host layers, respectively; guest and host layers are usually but not necessarily disjoint.

A link is a pair of ports, its end ports. Ports and links have layers; the layer of a link and its ports must be the same.

An adapter A=(P$\lambda$) of type T=(G,H,l) is a set P of ports and a labeling function $\lambda$: P → G ∪ H. Port p is a guest or host port as $\lambda$(p) ∈ G or $\lambda$(p) ∈ H, respectively. Port p must have layer l($\lambda$(p)). Adapter A can have at most one port with label k, if it exists, the port is denoted $A_k$.

A pairing of a set P of ports is a set of pairs {{$p_i$,$q_i$}} so that for each i, $p_i$, $q_i$ ∈ P, $p_i$≠$q_i$, $p_i$ and $q_i$ have the same layer, and each port of P appears in at most one pair.

A network N with signature (L, T) is a tuple (P,L,A,C,B) where P and L are sets of ports and links, respectively, with layers in L; A is a set of adapters with types in T; C, the set of connections, is a pairing of P; and B ⊆ P is the set of public ports. Ports p and q are connected in N if {p,q} ∈ C (note that by the definition of pairing, a port can be connected to at most one other port). A port is free if it is not connected to any other port. All public ports must be free. A port may appear at most once in a link or adapter; isolated if it does not so appear. The size of N, |N|, is the number of its ports. FIG. 1 depicts a small network.

Ports (N), pub(N) and conn(N) are written for the ports, public ports, and connections of N, respectively. 'a.b' indicates the pair {a, b} and 'a.b in N' indicates that {a, b} ∈ conn(N).

Network N is a subnetwork of network M if any port, link, adapter, or connection of N is a port, link, adapter, or connection of M, respectively. (Two ports connected in M need not be connected in N even if present in N.) If N is a subnetwork of M, M is a supernetwork of N.

Suppose M and N have the same signature. A bijection σ from the ports, links, and adapters of M to the ports, links, and adapters of N, respectively, is a local isomorphism if ports p and σ(p) have the same layer; port p is public iff σ(p) is public; p is an end port of link l iff σ(p) is an end port of σ(l); adapters A and σ(A) have the same type; A has a port with label l iff σ(A) has a port with label l; and σ($A_l$)=σ(A)$_l$. If in addition for all ports p, p' ∈ M, p·p' in M iff σ(p), σ(,p') in N. σ is an isomorphism. Two networks are isomorphic if there is an isomorphism from one to the other.

A network can be represented with a data structure in the obvious way, with a node in memory for each adapter, port and link. Constant time mappings are assumed from a link to its end ports, from a port to its containing adapter or link, from an adapter and a label to the corresponding port, and from a port to the port to which it is connected, if any.

Communication

Ports a and b communicate in a network N, a↔b, if they can be shown to communicate by the following inductive definition:

1. a and b are the end ports of a link; or
2. there are adapters A and B and a guest label g so that a=$A_g$, b=$B_g$ and for each host label h, either $A_h$ is connected to $B_h$, or $A_h$ is connected to a port a', $B_h$ is connected to b' and aˆ, b' communicate; or
3. there are ports a=$a_1$, $b_1$, $a_2$, $b_2$, . . . $a_k$, $b_k$=b so that $b_i$ is connected to $a_{i+1}$, i=1, . . . , k−1 and $a_i$ and $b_i$ communicate by rules (1) and (2), i=1, . . . , k.

If either of the first two cases hold, a and b communicate in one step, a↔b; if the third case holds, a and b communicate in k steps. See FIG. 1.

Proposition 2.1 If M is a subnetwork of N and p↔X p' in M, then p↔p' in N.

The level of a communicating pair {a,b} by is defined by induction: in case (1), the level of a pair of link end ports is 1; in case (2), the level is 1 plus the maximum level of any pair {a', b'}, or just 1 if all corresponds at pairs are connected; in case (3), the level is 1 plus the maximum level of any pair {$a_i$, $b_i$}.

Composition, Tests, Equivalence and Generalization

Suppose N and M are disjoint networks with the same signature and ø is a pairing of the public ports of N and M The composition $N_{oø}M$ is the network obtained by taking the union of the ports, links, adapters, connections, and public ports of M and N, respectively, then adding o to the connections and removing the ports connected in ø from the public ports. Composition is symmetric, i.e., $N_{oø}M=M_{oø}N$ associative as long as its defined (if σ pairs a port in N to a port in P, ($N_{oø}M$)$_{oø}P$ may be defined but $N_{oø}(M_{oø}P)$ is not).

A test for a set C of ports is a tuple (T, p, q, ø) where T is a network, p, q ∈ C∪pub(T), and ø is a pairing of C ∪ pub(T). T is the test network and p, q are the test ports. A network N with C ⊆ pub (N) satisfies the test if p and q communicate in $T_{oø}N$.

Suppose M and N have the same signature and pub(M) ⊆ pub(N). Network M is generalized by N (or N generalizes M), M≦N, if every test that satisfies M also satisfies N. Networks M and N are (externally) equivalent, N≡M, if M≦N and N≦M (equivalently if they have the same public ports and every test that satisfies one also satisfies the other). It is immediate that generalization is transitive and that external equivalence is an equivalence relation. In FIG. 2, E acts like a link; using theorems 3.3 and 3.7 below, it follows that A≦B≦C≦D≡E.

The Communication Graph

A set S={$p_1$, $q_1$, . . . , $p_k$ $q_k$} is a communicating chain (of length k) if $p_1$↔+$q_1$·$p_2$↔$q_2$ . . . $p_k$↔$q_k$. S is maximal if it is not a subset of any other communicating chain. If S is maximal, it is a cycle if $q_k$·$p_1$, otherwise $p_1$ and $q_k$ are the extremal ports of the chain. Necessarily, for each i, $p_i$ and $q_i$ are end ports of a link, or $p_1$ and $q_i$ are both identically-labeled guest ports of adapters of the same type. An induction shows the following.

Proposition 2.2 If p↔q, then there is a unique maximal communicating chain containing p and q.

Proposition 2.3 the communication graph is acyclic.

If there is an arc from P to Q in the communication graph, then l(P)>l(Q).

Proposition 2.4 The communication graph of network N can be constructed in time O(|N|).

Maintain a set L of communicating chains. L is initialized with all pairs {$p_i$, $q_i$} so that $p_i$,↔$q_i$ at level 1 (in one step); such pairs are either endpoints of links or corresponding guest ports of a pair of adapters with all corresponding pairs of host ports connected, and can be found by a linear-time scan e network. There are two types of events that modify L: merging, i.e., replacing {$p_i$, . . . , $q_l$}, {$p'_1$, . . . , $q'_j$} so that $q_i$·$p'_l$ with {$p_l$, . . . $p_i$, $p'_l$ . . . $q'_j$}, and adapter traversal, i.e., if A, A' are adapters of the same type, and for each host label h the ports connected to $A_h$ and $A'_h$ form the extremal ports of some chain in L, then each guest label g, the pairs {$A_g$, $A'_g$} are added to L. An induction on level shows that, after all events are processed, L contains exactly the maximal chains of N. The events can be implemented to take constant time for each pair ($p_i$, $q_i$) so that $p_i$,↔$q_i$ (in one step), and hence linear time overall.

The Adaptation Graph

A network signature may have an adapter-type cycle, that is, a set of adapter types $T_l$, . . . , $T_k$, $T_{k+1}$=$T_1$ so that a host layer of $T_i$ is a guest layer of $Ti_{+1}$. Such an adapter-type cycle may be necessary to model a class of networks of interest. Hence, it is possible that a network has an adapter cycle, that is, a set of adapters $A_l$, . . . , $A_k$, $A_{k+1}$=$A_1$ so that a host port of $A_i$ is connected to a guest port of $A_{i+1}$. It is submitted that any such adapter cycle in a network model can be deleted while preserving equivalence.

The adaptation graph of a network N is a directed graph whose nodes are guest ports and with an arc from $h_1$ to $h_2$ if $h_1$ is the guest port of an adapter with a host port connected to $h_2$. The acyclic core acyclic(N) is the network obtained from N by deleting, for each guest port g that appears in a cycle in the adaptation graph, the adapter containing g, all of its nonpublic ports, and any connection to a deleted public port. Any public port of a deleted adapter becomes isolated.

Proposition 2.5 Suppose there is an arc from p to q in the adaptation graph, and a node P containing p in the communication graph. Then, the communication graph contains a node Q containing q and an arc from P to Q.

Since p is part of a communicating chain, p↔p' for some port p'. Since there is an arc from p to q in the adaptation graph, p=$A_g$ and $A_h$·q for some adapter A. Since p↔p' and p=$A_g$, p'=$A'_g$ for some adapter A', $A'_h$, q' for some port q', and q↔q'. Hence, the required node and arc exist.

Let P be all ports contained in nodes of the communication graph, and let N* be the subnetwork of N induced by P, i.e., the network containing all ports of P, all connections between ports of P, any links containing ports in P, and any adapters containing ports in P together with all their host ports. Clearly, p↔q in N*. Any port on a cycle in the adaptation graph cannot be a port of N*, else N* would contain a cycle by proposition 2.5. Hence, N* is a subnetwork of acyclic (N), so p↔q is acyclic (N) by proposition 2.1.

Corollary 2.7 N≡acyclic(N).

Suppose (T, p, q, ø) is a test for pub(N). By proposition 2.1, p↔q in acyclic (N) °$_\sigma$T implies p↔q in (N)°$_\sigma$T. Conversely, p↔q in (N)°$_\sigma$T implies p↔q in acyclic (N°$_\sigma$T) by proposition 2.6. Acyclic (N°$_\sigma$T) is a subnetwork of acyclic (N)°$_\sigma$T as any cycle in the adaptation graph of N is still a cycle in the adaptation graph of N°$_\sigma$T. Hence, p↔q in a acyclic (N)°$_\sigma$T.

Pasting Paths

For S, a pairing of pub(N), N[S] is written for the network obtained by adding S to the connections of N and removing ports paired in S from pub(N). Equivalently, N[S] is No$_s$ ∈, where ∈ is the empty network. For simplicity, e.g., N[p·q] is written for N[{p·q}].

Lemma 2.8 Suppose s,s', t, t' are all distinct and have the same layer, p↔p' in N[s·s'] and t↔t' in N. Then p↔p' in N[s·t, s'·t']. Lemma 2.8 is false if the hypothesis 't↔t' in N' is replaced with 't↔t' in N[s·s'])

Lemma 2.9 Suppose $s_i$, $s'_i$, $t_i$, $t'_i$, i=1, ..., m, are all distinct, and for each i, $s_i$, $s'_i$, $t_i$, $t'_i$ have the same layer. Let S={$s_i$, $s'_i$: i=1, ..., m} and Uj={$s_i$·$t_i$, $s'_i$·$t'_i$: i≦j}, j=0, ..., m. If p↔p' in N [S] and $t_j$↔$t'_j$ in N[$U_{j-1}$], j=1, ..., m, then p↔p' in N[$U_m$].

Let $T_j$={$s_i$·$s'_i$: i>j}∪$U_j$, j=1, ..., m. For j=1, ..., m using lemma 2.8 it can be shown that p↔p' in N[$T_j$]. The lemma follows since $T_m$=$U_m$.

Simple Multiplexing

An adapter type is simple if it has one host label. A network is simple if it only contains adapters with simple adapter types. Throughout this section all networks are simple.

Normal Forms

Network M reduces in one step to N if N is obtained from M in one of the following ways:

Link collapse: M contains a link l with ports p and q, not both of which are public. Link l is deleted if p·p' and q·q', then the connections to p and q are deleted and the connection p'·q' is added. If one port, say q, is public, and p is connected to a port p', then in addition p' is deleted and replaced by q.

Adapter elimination: M contains a pair of adapters A and B with connected host ports. Adapters A and B are deleted. If A and B had the same type, then for each guest label g so that A and B both have a port with label g, $A_g$ and $B_g$ become the end ports of a new link.

Free port elimination: A port p that is free and not public is deleted. If p is the end port of a link, then the link is deleted. If p is a host port or the last guest port of an adapter, the adapter is deleted.

Isolated port elimination: If port p is isolated and not public, it is deleted.

For example, in FIG. 3, E reduces in one step to D. After a link or adapter is deleted, various ports can become isolated or free but not public. Such ports are deleted by the last two rules. For example, consider a link with its two end ports connected to each other. The link is deleted by the 'link collapse' rule, and then the two ports are deleted by the 'isolated port elimination rule'.

A network is reducible if some reduction applies, otherwise it is irreducible.

Lemma 3.1 Let p and g be the number of ports and guest ports of M, respectively. M reduces in at most p+g steps to a unique irreducible network, denoted red(M), satisfying M≡red(M).

A case analysis shows that M reduces in one step to both N and P, then either N=P, N reduces in one step to P (or P to N), or there is a network Q so that both P and N reduce in one step to Q; uniqueness of irreducible network follows.

Suppose M reduces in one step to N. It can be checked that M and N have the same public ports; for public ports p and q, p↔q in M iff p↔q in N; and for any T, σ, M°$_\sigma$T reduces in one step to N°$_\sigma$T. M≡red (M) follows.

The irreducible network red(M) may have adaptation cycles, while acyclic(red(N)) may have isolated or free non-public ports. The normal form of network N, nf(N), is red (acyclic(red(N))).

Lemma 3.2 Let N be a simple network
1. N≡nf(N).
2 The adaptation graph of nf(N) is acyclic.
3. If p·q in nf(N), then p and q are both guest ports, or one is a host and the other a guest port.
4. All free ports of nf(N) are public.
5. p↔q in nf (N) iff p and q are public end ports of a link.
6. The normal form of N can be constructed in time O (|N|).

For part 2, there are certainly no instances of link collapse or adapter elimination rules in nf(N), hence non in N*=acyclic(red(N)). The free port and rules may apply to N*, but these cannot introduce cycles. For part 6, each possible reduction is determined by a constant-sized portion of the network. It suffices to maintain a queue of all possible reductions in the current network. The queue can be initialized by a linear scan of the network. Applying a reduction and checking locally for any newly possible reduction each take constant time, hence linear overall by lemma 3.1.

An adaptation tree is a network with only guest-host connections and whose adaptation graph is acyclic. An adaptation tree has a set of free guest ports, the leaf ports, and a unique free host port, the root port. It follows immediately from lemma 3.2 that if all guest-guest connections are deleted, a normal form network composes into a set of links and a set of adaptation trees.

External Equivalence

Theorem 3.3 Suppose M and N are simple networks with the same public ports. Then, M≡N if and only if there is an isomorphism mapping nf(M) to nf(N) that is the identity on public ports.

By lemma 3.2, it can be assumed that M and N are in normal form. If the isomorphism exists, M≡N.

Conversely, suppose M≡N. Define the 'copy' network C=C (M) to be an isomorphic copy of adaptation trees composing M after guest-guest connections are deleted. More precisely, for each adaptor A of M, C contains an adapter c(A) of the same type, with a port c(A)$_l$ for each port $A_l$ of M; c($A_l$) is the other host port. All ports free in C are public. FIG. 4 illustrates an example of M$_{∘∘}$C. As shown in FIG. 4, 1, 2, 3, 4, are guest labels, and no host labels shown. Ports g and g' are connected together in M. M has two public host ports h, h' with h·c(h), h'·c(h')∈σ; r is a public guest port of M.

Define a to be the connections {h·c(h)}, where h varies over free host ports of C. It can be shown that g↔c(g) in M$_{∘∘}$C for any guest port g of M A test port is a guest port of C or a public guest or link port of M. Clearly, a test port is a port of both M$_{∘∘}$ C and N$_{∘∘}$ C. The parent of a guest port g is the port connected to the host port of the adapter containing g.

Prosition 3.4 Let p, p' be test ports. Then, p↔p'in M$_{∘∘}$ C if either p=c(g)↔g·g'↔c(g')=p', for some guest ports g, g'∈ M; or p, p'' end ports of a link of M, or p=g↔c(g)=p', for a public guest port g ∈ M.

Suppose p↔p'. If p is an end port of a link, necessarily in M, then the other end port must be p', since link ports are free. If one of p, p' is a public guest port of M, say p, then p↔c(p) and c(p) is free, so p'=c(p). Otherwise, p, p' are both guest ports of C and p=c(g)↔g, some guest port g∈M. With g≠p', g ∈ M, the only connections to a guest port in M are to a host port or another guest port of M, but the former is impossible since there can be no communication starting with a host port, so g·g' for g' ∈ M a guest port, Hence, c(g)↔g·g'↔c(g')=p', since c(g') is free.

Proposition 3.5 If p, p' are test ports, then p↔p' in N°₀C iff p↔p' in M°₀ C.

If p, p' are both public ports (of M or C), the conclusion is an immediate consequence of M≡N using C as a test network. If, say, p=c(g) is not public, then it must be a guest port of C connected to a host port of C. Port p communicates with no other test port in M₀₀ C. It can be shown that p communicates with no other test port p' in N₀₀ C; this follows using M≡N and a test C' obtained from C by deleting the connection top and possibly to p'.

For theorem 3.3, there are no guest ports r, r'∈ N that communicate in N₀₀ C. If there were, choose such r, r' of minimal level. The corresponding host ports are not connected since N is in normal form. Hence, the parents p, p' communicate. The parents cannot be host ports, so the parents must be in N since σ only has connections to host ports. The parents cannot be link ports since N is in normal form. So the parents are guest ports of N, contradicting the choice of r, r'

For any guest port c(g), c(g) communicates with some port in N₀₀ C, this is immediate by proposition 3.4 for each leaf guest port, and hence follows for all guest ports in an adaptation tree. For g a guest port of M, define e(g) to be the port that c(g) communicates with in one step, c(g)↔e(g) in N₀₀ C. e(g) ∈ N. If not, then e(g) ∈ C and e(g)=c(g'), some g'. The parents p, p' of g, g', respectively, communicate in N C. By proposition 3.4, c(g)↔g·g'↔c(g') in M°₀C, hence the parents p, p' do not communicate in M°₀C, contradicting proposition 3.5.

The maximal communicating chain containing c(g) is either c(g) ↔e(g), or c(g)↔e(g). e(g')↔c(g'), where g·g' in M. So suppose c(g)↔e(g)·r↔s; r cannot be a link port of N, since N is in normal form, and C contains no links, so r and s must be guest ports. Hence, r ∈ N, s ∉N, so s=e(g'), some g', r=e(g'), and g·g' in M.

e is extended to adapters and host ports: if g=A₁ and e(g)=A'ₚ, it can be checked that the types of A and A' agree and l=l'; set e(A)=A' and e(An)=A'ₕ, h the host label of A.

e is extended to be the identity on link ports. It is noted that any end port p of M must be public, hence also public in N. If p, q are end ports of a link, then p↔q in M, and by lemma 3.2, p and q are end ports of a link in M.

It can be checked that e is a local isomorphism into its range. To show e is the desired isomorphism, it remains to show that e preserves connections and its range is all of M.

If guest ports g, g' are connected in M, then by proposition 3.4, c(g)↔e(g)·e(g')↔c(g'), so e(g)·e(g'). Suppose host port h is connected to guest port g in M Let g' be a guest port of the adapter containing h, then c(g') ↔e(g'), and e(h) is the host port of the adapter containing e(g'). Hence, c(g)↔r where r·e(h). By proposition 3.4, either c(g) ↔e(g), or c(g) ↔e(g)· e(g') ↔c(g'); the latter is impossible because then g·g', some guest port g', but g·h. Hence r=e(g) and e(g)·e(h).

e is one-one since c is one-one and communication chains are uniquely determined. Since e is one-one, N has at least as many ports as M However, the entire construction is symmetric in M and N, so M and N must have the same number of ports. Hence e is onto.

A doubled network is obtained from two isomorphic adaptation trees by connecting all corresponding of free guest ports. Clearly, the only free ports in a doubled network are the two root ports. In FIGS. 3, A, B, and C are doubled networks.

Let M be a simple network. Suppose ports {p, q} form the root pair of a doubled subnetwork of M. Network N is obtained by strengthening the pair {p,q} if N results by replacing the doubled subnetwork with a link L with end ports p and q, preserving any connections to p and q, and then applying the link collapse rule to 1, if possible. For example, if p·p' and q·q' in M, then p'·q' results in N. A network is a strengthening of M if it is obtained by strengthening zero or more root pairs of doubled networks. The strengthening is in normal form if M is in normal form. In FIG. 3, B is a strengthening of A, and D is a strengthening of A, B, and C.

Proposition 3.6 Suppose p↔q in M and N is a strengthening of M Then, p↔q in N.

Theorem 3.7 Suppose M and N are simple networks with the same public ports. Then, M≦N if and only if nf(N) is isomorphic to a supernetwork of a strengthening of nf(M).

If nf(N) is isomorphic to a supernetwork of a strengthening of nf(M), then M≦N follows from propositions 2.1 and 3.6.

For the converse, suppose M≦N, it can be assumed that M and N are in normal form. Let C=C(M) and σ be as in the above discussion of the theorem 3.3. It is noted that for every pair of test ports p, p', p↔p' in M₀₀ C implies p↔p' in N₀₀ C, but not necessarily the converse. As before, for g a guest port of M, define e(g) by c(g)↔e(g) in N₀₀ C. Then, g, c(g), and e(g) are all identically-labeled guest ports of identically-typed adapters. As before, extend e to the adapter containing g and its host port, and to links of M It can be checked that e is a local isomorphism of M into its range in N₀₀ C.

Guest port g of M is doubled if e(g) ∈ C and mapped if e(g) ∈ N. Two guest ports of the same adapter are either both doubled or both mapped; hence "doubled" and "mapped" can be extended to adapters and host ports of M as well. FIGS. 5A through 5C each illustrate a number of modeled network components. As shown in FIG. 5, M<N. Ports g'' and q are connected and are guest ports of adapters A and B, respectively, with the same label 1. In N₀₀ C, guest port g of M is mapped, i.e., e(g)∈ N, while g'' is doubled, i.e., e(g'')∈ C. Note e(g'')=c(q). The host ports h and h' connected to g and g' in M (not labeled) form a strengthening pair.

If guest port g is mapped, and g has a parent p ∈ M, then an argument shows p is mapped as well, and furthermore e(p) is the parent of e(g). If g is doubled, then e(g)=c(q) for some q ∈ M; if furthermore has a parent p and p is doubled, then suppose g is both mapped and the parent of a doubled guest port g''. An argument shows there is a mapped guest port g' so that c(g)↔e(g)·e(g))↔c(g') where e(g), e(g') ∈ N and c(g') is the parent e(g''). See FIG. 5. The pair {h,h'} of host ports connected to g,g' are a critical pair.

There are two more cases to consider. First, if g is mapped but has no parent in M, then necessarily the host port h of the adapter containing g is public; an argument shows h·e(h). Second, suppose g doubled but has no parent in M, then again the host port h is public. Let e(g)=c(g') and h' the host port of the adapter containing g'; an argument shows h and h' are connected to the end ports of a link l in M. Again, {h, h'} form a critical pair; l is a strengthening link.

By construction, each critical pair {h,h'} forms the root pair of a doubled network. Let M* be the network obtained by strengthening each critical pair, and let N* be the image in N of the mapped ports and adapters, together with any strengthening links. It can now be checked that e is an isomorphism from M* to N*. Of course, N* may be a subnetwork of N, so N is isomorphic to a supernetwork of a strengthening of M Theorem 3.8 Let M and N be simple networks with the same public ports. There are algorithms to decide if M_N or M<N that run in time O (|M|+|N|).

To decide M≡N, compute nf(M) and nj(N) and then decide if there is an isomorphism from nf(N) to nf(M). Testing isomorphism in linear time is done by: a partial isomorphism (the identity) is given for public ports; ø can be extended through links, connections, and from one port of an adapter to all ports, since in each case the extension is uniquely determined. Either ø extends to all of nf(N), or a proof of nonisomorphism results. The procedure to decide M≦N is similar.

Reverse Multiplexing

Networks with "reverse multiplexing," i.e., with adapters with more than one host port, are now considered. The external behavior of such networks is more complex than with simple multiplexing. Consider the network N in FIG. 6A, which has two adapters each with two host ports, with one pair connected together. As depicted, no pair of ports communicate. However, if ports a, a' are connected (or connected to a communicating pair of ports), then c, c' communicate; this dependent behavior is not possible with simple networks. In FIG. 6C, ports c, c' communicate only if ports a, a' are connected and also ports b, b' are connected. In a certain sense, FIG. 6C acts like a boolean 'and' gate; this connection is explored further below.

While the notion of normal form does extend to networks with reverse multiplexing, it does not immediately yield algorithms for equivalence and generalization. FIGS. 6A through 6D illustrate examples of reverse multiplexing. FIG. 6B generalizes FIG. 6A; FIGS. 6C and 6D are equivalent. In FIG. 6, A≦B and C≡D. For example, the two networks of FIG. 6C and FIG. 6D are equivalent and in normal form, but are not isomorphic. Similarly, the network of FIG. 6B generalizes that of FIG. 6A. To obtain equivalence and generalization algorithms, a theory 'basic tests' is developed. The 'basic tests' of a network M can be obtained from its normal form, M satisfies its own basic tests. The main result (theorem 4.6) is that if any other network N also satisfies M's basic tests, then M≦N. This will immediately yield algorithms to test if M≦N or M≡N.

Generally, to test if two networks M and N are equivalent, the following steps are performed:

1. Form the basic tests of M;
2. Determine if each basic test of M is satisfied by N;
3. Repeat with the roles of M and N reversed; and
4. If all basic tests are satisfied, then M is equivalent to N, otherwise, if any fails, the networks M and N are inequivalent.

Tentative Pairing

"Tentative communication" of ports and "tentative pairing" of adapters ar defined simultaneously by following recursive definition. Two adapters A and B of the same type are tentatively paired if either 1. For some host label h, $A_h'$, $B_h'$; or
2. For some host label h and some sequence of guest ports $c_1, d_1, \ldots, c_n, d_n$, $c_i$ and $d_i$ tentatively communicate, for each i=1, ..., n, and $A_h$ $c_1$, $d_i$ $c_{i+1}$ for i=1, ..., n−1, and $d_n \cdot B_h$.

Two ports c, d tentatively communicate, written c □ d, if $c = A_g$, $d = B_g$, for some tentatively pair adapters A and B and guest label g.

Ports a and b are tentatively connected if there is a sequence $c_1, d_1, \ldots, c_n, d_n$, n≧1, so that $a \cdot c_1$ □ $d_i \cdot c_2$ □ $d_2 \ldots c_n$ □ $d_n \cdot b$.

Suppose adapters A and A' are tentatively paired. A host port $A_h$ is a guard if it is not connected or tentatively connected to $A'_h$; the pair $\{A_h, A'_h\}$ is a tentative guard pair. In FIG. 6c, the two adapters are tentatively paired, c □ c', and {a, a'} and {b, b'} are guard pairs.

Reduction

Network M reduces in one step to N if N is obtained from M by the link collapse, free port elimination, or isolated port elimination rules, or by one of the following rules:

Adapter elimination: M contains a pair of adapters A and B of the same type, and for each host label h, $A_h \cdot B_h$, N is obtained by deleting A and B. In addition, for each guest label g so that both A and B have ports with label g, $A_g$ and $B_g$ become the end ports of a new link.

Adapter mismatch: M contains a pair of adapters A and B with connected host ports, and either the adapter types do not match or the host labels do not match. N is obtained by deleting A and B.

Multiple tentative pairing: M contains distinct adapters A, B, and C so that A is tentatively paired with both B and C. N is obtained by deleting A, B, and C.

A network is irreducible if no reduction applies. By the second rule, in an irreducible network an adapter is tentatively paired with at most one other adapter.

As discussed above, a network N reduces in a finite number of steps to a unique irreducible network red(N) preserving public ports and equivalence.

The tc Graph

Figure 7:
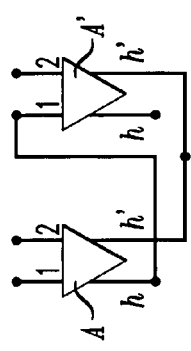
FIG. 7 illustrates adapters A and A' that are tentatively paired.

In the section above entitled "The Adaptation Graph," networks were simplified by removing subnetworks that caused cycles in the adaptation graph. This removal preserved equivalence, since the cycle-inducing subnetworks could never be used to form communicating pairs. With reverse multiplexing, a generalization of adaptation graph is necessary. Consider the network N in FIG. 7. FIG. 7 illustrates adapters A and A' that are tentatively paired, so, e.g., $A_2$ □ $A'_2$; however, there is no supergraph in which $A_2 \leftrightarrow A'_2$. The adaptation graph is acyclic; in the tc-graph, there is an arc from $\{A_1, A'_1\}$ to itself.

Adapters A and A' are tentatively paired, so e.g., $A_2$ □ $A'_2$. The adaptation graph of N is acyclic. However, it can be checked that there is no supergraph of N in which $A_2 \leftrightarrow A'_2$; hence if N were to appear as a subnetwork of another network, it could be removed.

Let N be an irreducible network. A tc-chain is a set of guest ports $\{p_1 p_2, \ldots p_n\}$, n≧1, such that i=1, ..., n−1, either $p_1 \cdot p_{i+1}$ or $p_1 \leftrightarrow p_{i+1}$; it is maximal if it is not a subset of any other tc-chain. It can be checked that any guest port is in a unique maximal tc-chain.

The tc-graph is a directed graph. Its nodes are maximal tc-chains. There is an arc from tc-chain P to Q. The tentatively communicating acyclic core, tca(N), is the network obtained from N by deleting, for each guest port p ∈ P where P appears in a cycle in tca(N), the adapter containing P and all its nonpublic ports. For the network N in FIG. 7, tca(N) consists only of isolated ports, the ports public in N.

Proposition 4.1 Suppose there is a directed arc from P to Q in the tc-graph, and a node P' with P ⊆ P' in the communication graph. Then, the communication graph contains a node Q' with Q ⊆ Q' and an arc from P' to Q'.

Lemma 4.2 N tca(N)

Normal Forms

A backbone adapter is an adapter that is not tentatively paired; its ports are backbone ports. The noiiiial form of network N, nf(N), is red(tca(red(N))).

Lemma 4.3 Let N be a network.

1. N≡nf(N).
2. The tc-graph of nf(N) is acyclic.
3. If backbone port p and q are tentatively connected, then at least one of p and q is a guest port.
4. All free ports of nf(N) are public.

5. If A, A' are tentatively paired adapters, and h is a host label, then either $A_h$ is a guard, $A_h \cdot A'_h$, or $A_h$ is tentatively connected to $A'_h$.

Suppose k is a node of the tc-graph of N. Network $N_k$ is the subnetwork of N obtained as follows: for every tc-graph node r reachable from k in the tc-graph, and for every guest port g ∈ r, $N_k$ contains g, it is adapter, and every host port of the adapter. Two ports of $N_k$ are connected if they are connected in N. A peak is a node of the tc-graph with indegree 0. Peaks can be classified as follows.

A full peak is of the form $p_1 \cdot p_2 \leftrightarrow p_3 \ldots p_{n-2} \leftrightarrow p_{n-1} \, p_n$, i.e., it starts and ends with a connection; necessarily $n \geq 2$ is even. Both $p_1$ and $p_n$ must be guest ports of backbone adapters, for if either adapter were tentatively paired, then one of $p_1$ and $p_n$ would tentatively communicate with another port, contradicting the maximality of the tc-chain.

A half peak is of the form $p_1 \cdot p_2 \cdot \leftrightarrow p_3 \ldots p_{n-1} \leftrightarrow p_n$, i.e., starting with a connection and ending with tentative communication, or the reverse. Port $p_1$ must be a guest port of a backbone adapter, and $p_n$ must be free, hence public. Possibly $n=1$, in which case $p_1$ is a public guest port of a backbone adapter.

A link peak is either a link or of the form $p_1 \square p_2 \ldots p_{n-1} \square p_n$, i.e., starting and ending with tentative communication; necessarily $n \geq 2$ and $p_1$ and $p_n$ are both public.

Figure 8:
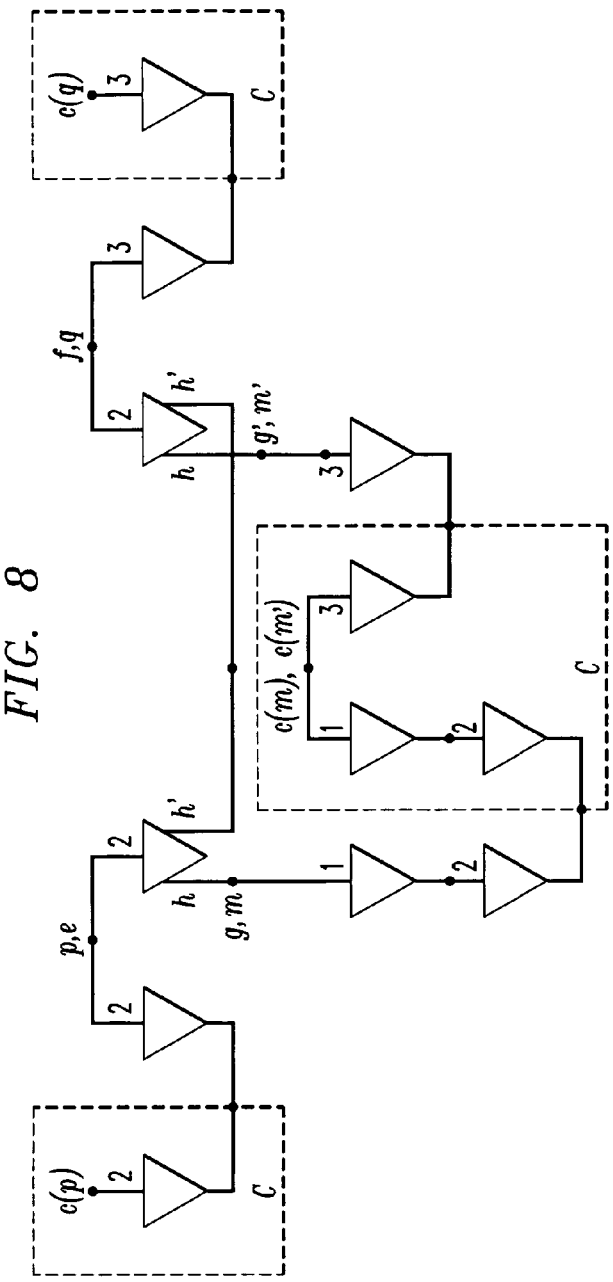
FIG. 8 illustrates an example of a copy network construction.

In FIG. 8, {p, e, f q} is a full peak; in FIG. 4, {r} is a half peak.

Basic Tests

Let N be a network in normal form. The 'copy' network C=C(N) is a copy of the backbone of N, with tentative connections collapsed to connections. More precisely, for each backbone adapter A of N, C has an adapter c(A) of the same type, and for each port $A_1$ of A, c(A) has a port $c(A)_1$, with the same layer label. c is extended to ports by defining $c(A_1)=c(A_1)$. Two ports c(g) and c(h) are connected in C if g and h are connected or tentatively connected backbone ports in N, and one of g, h is a guest port and the other a host port. All free ports of C are public. Notice that C has no links. FIG. 8 illustrates an example of a copy network construction. As shown in FIG. 8, a subnetwork inside dotted boxes is C; the remainder is N. 1, 2, 3 are guest labels, h, h' are host labels. Ports g and g' are guards; m, m' guest ports, g·m, g'·m'. The surrogate s(g) =c(m), similarly s(g')=c(m'), k={p,e,f,q} is a full peak, where p·e □ f·q. The test ports are c(p) and c(q), which communicate in $C^o_\sigma$ N.

A port p is tentatively free if it is free or $p \cdot e_1 \square f_1 \cdot e_2 \square f_2 \ldots e_n \square f_n$ and $f_n$ is free; the representative of p, r(p), is p itself in the former case and $f_n$ in the latter case.

Let $\phi=(r(h) \cdot c(h)$: h a tentatively free nonguard host port of N}.

For k a peak, let $C_k$ be the subnetwork of C obtained from the backbone adapters of $N_k$. Let $\phi_k=\{r(h) \cdot c(h) \epsilon \phi$:h in $N_k\}$. Let G be the set of tentative guard pairs of N and $G_k=\{\{g, g'\} \epsilon G$: g, g'in $N_k\}$. ('g' is used for guard, even though a guard is actually a host port.)

The surrogate s(g) of guard g is r(g) if g is tentatively free in N; otherwise s(g) is c(m), where m is the backbone guest port tentatively connected to g. See FIG. 8. For $G^* \subseteq G$ define $S(G^*)=\{s(g) \cdot s(g')$: $\{g,g'\} \epsilon G^*\}$.

The basic test for peak k of network N is the tuple ($C_k$,a, b,w), where $w=\phi_k \cup S(G_k)$ and the test ports a, b are defined as follows. Suppose $k=p_1, \ldots p_n$. If k is a link peak, $\{a,b\}=\{p_1, p_n\}$. If k is a full peak, $\{a, b\}=\{c(p_1),c(p_n)\}$. If k is a half peak, with $p_1$ the backbone guest port, then $p_n=r(p_1)$ and $\{a,b\}=\{c(p_1),p_n\}$.

Lemma 4.4 Let ($C_k$, a, b, w) be the basic test for peak k of network N, and let $T=C_k o_w$ N. For every backbone guest port p of $N_k$, p and c(p) communicate in T. If $p \leftrightarrow q$ in $N_k$, then $p \leftrightarrow q$ in T.

Both statements are shown by simultaneous induction on the ordering implied by the tc-graph of N.

Suppose p is a backbone guest port, $p=A_g$ for some adapter A and guest label g. It is shown that for each host label h, $A_h$ is connected or indirectly connected to $c(A)_h$ in T (i.e., $A_h$ $q \leftrightarrow q'$. $A_h$ some q, q'); this implies $p \leftrightarrow c(p)$ in T. If $A_h$ is free in N, then by definition $A_h \cdot c(A)_h$ in T. Suppose $A_h$ is not free but is tentatively free, i.e., $A_h \cdot c_1 \square d_1 \ldots c_n \square d_n$ in N with $d_n$ free. Then $d_n=r(A_h)$ and $d_n \cdot c(A)_h$ in T; by induction hypothesis, $c_i \leftrightarrow d_1$ in T. Hence $A_h$ is indirectly connected to $c(A)_h$. Finally, suppose $A_h$ is tentatively connected to some guest port $A'_g$ of adapter A' in N. By using the induction hypothesis, $A_h$ is indirectly connected to $A'_g$ in T Again, by the induction hypothesis $A'_g$ communicates with $c(A')_g$ in T. By definition $c(A')_g \cdot c(A)_h$ in $C_k$. Hence, again $A_h$ is indirectly connected to $c(A)_h$ in T.

Suppose $p \square q$, where $p=A_g$ and $q=A'_g$ for some tentatively paired adapters A and A' and some guest label g. It is shown that for each host label h, $A_h$ is connected or indirectly connected to $A'_g$. By lemma 4.3, either $A_h, A'_h$, or $A_h$ tentatively connected to $A'_h$, or $A_h, A'_h$ both guards. There is nothing to show in the first case, the second case follows using the induction hypothesis. So suppose $A_h, A'_h$ are both guards. By definition φ, connects the surrogate $s(A_h)$ with the surrogate $s(A'_h)$. If the surrogate $s(A_h)$ is not $A_h$, then $A_h \cdot r$ and $s(A_h)=c(r)$ for some guest port r, by induction hypothesis r communicates with c(r.) Similarly, $A'_h$ is either its own surrogate, or is connected to a port that communicates with its surrogate. Hence $A_h$ is connected or indirectly connected to $C(A)_h$.

Corollary 4.5 Network N satisfies its own basic tests.

Suppose $k=\{p_1, \ldots p_n\}$ is a peak and ($C_k$, φ, a, b) the corresponding basic test. If k is a link peak, then $a=p_1 \square p_2 \cdot p_3 \square p_4 \ldots p_{n-1} \square p_n=b$. Using lemma 4.4, a and b communicate. If k is a full peak, then $a=c(p_1), p_1 \cdot p_2 \square p_3 \ldots p_{n-2} \square p_{n-1} \cdot p_n$, and $b=c(p_n)$. Again, by lemma 4.4, a and b communicate. The case that k is a half peak is similar.

Generalization

Theorem 4.6 Suppose $pub(M) \subseteq (pub(N)$. Then, $M \leq N$ iff N satisfies every basic test of M.

Trivially, $M \leq N$ implies that N satisfies every basic test of M Throughout the section, M and N are networks that satisfy the hypothesis of the theorem and (Qy,y', σ) is a test that satisfies M, i.e., y and y' communicate in $M_{oo}Q$. The theorem will be proved if it is shown that y and y' communicate in $N_{oo}Q$. By lemma 4.3, it can be assumed that M is in normal form. Let n be the maximal communication chain containing y, y'; by pruning M and Q as necessary, it can also be assumed that $M_{oo}Q=(M_{oo}Q)_n$. Thus, every port of $M_{oo}Q$ appears in some communication chain. It simplifies the argument a bit to assume that there is no connection m·m'εσ with m, m' in M; any such connection could be replaced with connections in σ from m, m' to the end ports of a new link in Q. Similarly, it can be assumed that y, y'ε Q.

Figure 9:
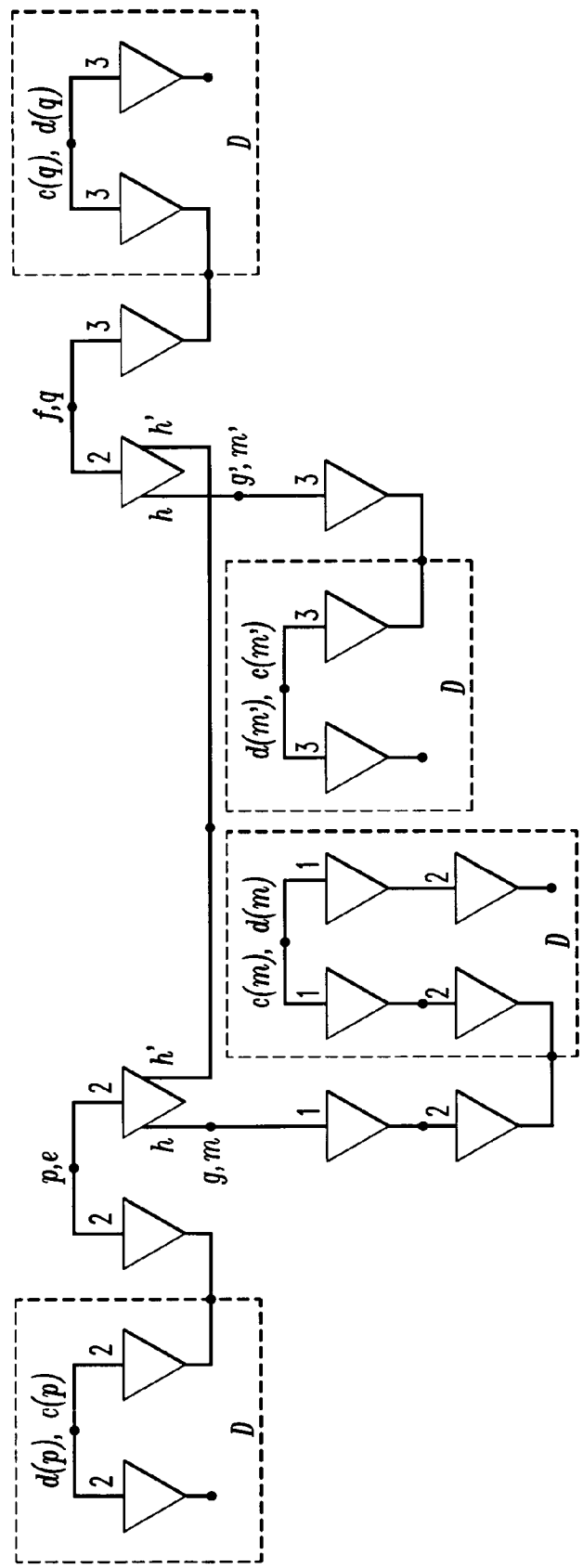
FIG. 9 illustrates a network $M_{o\phi}D[T(\{g, g'\})]$.

The doubled network D=D(M) consists of C=C(M) and another network isomorphic to C, with corresponding guest ports connected. More precisely, for each backbone adapter A of N, D has an adapter of the same type, and for each port $A_1$ of A, d(A) has a port d(A), with the same layer and label. d is extended to ports by defining $d(A_l)=d(A)_l$. If d(p) is a free guest port in D, then c(p) is as well; c(p) and d(p) are connected in D. FIG. 9 illustrates a network $M_{o\phi}D[T(\{g,g'\})]$.

$s(g)=c(m)$, $t(g)=d(m)$, $s(g')=c(m')$, and $t(g')=d(m')$. The pairing $S(\{g, g'\})$ could connect $c(m) \cdot c(m')$.

An observable port is a port of Q or a backbone port of M. d is extended to be the identity on Q, i.e., $d(p)=p$ if p is a port of Q; then d is defined for all observable ports.

Recall $\phi$ connects $r(h)$ to $c(h)$, for each tentatively free nonguard host port h of M The pairing $\sigma'$ is obtained from a by replacing any connection to $r(h)$ with a connection to $d(h)$ and by deleting any connections to the representatives $r(g)$, g a tentatively free guard.

Connections to guards are not yet specified. Recall G is the set of tentative guard pairs of M Let $\{g,g'\}$ in G. By assumption, corresponding guest ports of the adapters containing g, g' communicate in, $M_{\circ \circ}Q$, so g, g' are indirectly connected, though also by assumption $g \cdot g' \notin \sigma$.

$t(g)$ is defined as follows. If g is tentatively free in M, and $r(g)$ is the representative of g, then the surrogate $s(g)=r(g)$ is a public port of M, $s(g) \cdot \notin \sigma$ for some port $q \in Q$; $t(g)=q$. Otherwise, g is tentatively connected to backbone port p in M, then $s(g)=c(p)$; $t(g)=d(p)$. See FIG. 9. The following restatement is useful below: if p is the observable port indirectly connected to g, then $t(g)=d(p)$.

For $G^* \subseteq G$, let
$T(G^*)=\{s(g) \cdot t(g), s(g) \cdot t(g') : \{g,g'\} \in G^*\}$ and recall that $S(G^*)=\{s(g) \cdot s(g')) : \{g,g'\} \in G^*\}$.

For p an observable port, $l(p)$ denotes the level of the maximal communication chain containing p in $M_{\circ \circ}Q$; for g a guard, $l(g)=l(p)$, where $g \cdot p$. $l(y)=l(y')$ and if $\{g,g'\} \in G$, $l(g)=l(g') < l(y)$. For $m=0, 1, \ldots, l(y)$, let $Hm=\{\{g,g'\} \in G: l(y) < m\}$, so $H_{l(y)}=G$, and define
$N_m = No_\phi D[T(H_m)]o_{\sigma'} Q$.

The communication hypothesis at level m is the following statement:

Suppose p,p are observable ports, $p \leftrightarrow p'$ in $M_{\circ \circ}Q$, and $l(p)=m$. Then, $d(p) \leftrightarrow d(p')$ in $N_m$.

Lemma 4.7 Suppose k is a peak of M, a, a' are the test ports of the basic test for k, and the communication hypothesis holds at levels lees than $m=l(k)$. Then, $a \leftrightarrow a'$ in $N_m$.

For the rest of this paragraph, index the elements of $G_k=\{\{g_i,g_i'\}:=i=1, \ldots, n\}$ so that $i<j$ implies $l(g_i) \leq l(g_j)$. Clearly, $l(g_i)<m$ for any $\{g_i,g_i'\} \in G_k$. For $j=0, \ldots, n$, let $G_{kj}=\{\{g_i,g_i'\}: i \leq j\}$, so $G_{ko}$ is empty and $G_{kn}=G_k$.

Let $(C_k, a, a', w)$ be the basic test for k in network M, where $w=\phi_k \cup S(G_k)$. Since N satisfies all the basic tests of M, $a \leftrightarrow a'$ in $No_w C_k$. $C_K$ is a subnetwork of D and $\phi_K \subseteq$, so $No_w C_k$ is a subnetwork of N $D[S(G_k)]$, and hence of $N_{\circ \circ \phi}D\{T(H_l \backslash G_k) \cup S(G_k)\}$. By lemma 2.1, $a \leftrightarrow$ in $No_{100} D\{T(H_l \backslash G_k) \cup S(G_k)]o_{\sigma'} Q$. (1)

Choose $\{g_i, g_i'\} \in G_k$. Then $g_i, g_i'$ are indirectly connected to observable ports p,p', respectively, with $p \leftrightarrow p'$ in $M_{\circ \circ}Q$. By the induction hypothesis, $t(g_1)=d(p) \leftrightarrow d(p')=t(g_i')$ in $N_{\circ \circ}D[T(H_{l(g1)})]_{\circ \circ}Q$ and $H_{l(g1)} \subseteq G_{ki-1} \cup H_m \backslash G_k$. Hence, $t(g_i) \leftrightarrow t(g_i')$ in $No_\phi D(T(G_{kl-1} \cup H_m \backslash G_k)]o_{\sigma'}Q$ (2)

Using equations (1) and (2) and lemma 2.9

$a \leftrightarrow a'$ in $N0_\phi D[T(G_{kn} \cup H_m \backslash G_k)]o_{\sigma'}Q$, Since $G_k=G_{kn}$, the lemma is established.

Lemma 4.8 The communication hypothesis holds for all levels.

Suppose $p \leftrightarrow p'$ in $M_{\circ \circ}Q$. It can be shown that $d(p) \leftrightarrow d(p')$ in $N_m$ in two steps first if $p \leftrightarrow p'$ in one step, and next if $p \leftrightarrow p'$ in more than one step.

Suppose $p \leftrightarrow p'$ in $M_{\circ \phi}Q$ in one step and p, p' are end ports of a link. If the link is in M, p, p' must be public, and p, p' are end ports of a link in N. Otherwise, the link is in Q. In either case, $p \leftrightarrow p'$ in $N_l$.

Now suppose $p \leftrightarrow p'$ in $M_{\circ \phi}Q$ in one step and $p=A_g$, $q=A_g'$ for some adapters A and A' and guest label g. Consider a host label h of A. In $M_{\circ \phi}Q$, either $A_h \cdot A_h'$ or for some ports s and s', $A_h$·s, $s' \cdot A_h'$, and s communicates with s'. It is assumed the latter case; the former is similar and easier. It can be shown that $d(A_h) \cdot d(s)$ or $d(A_h) \cdot s \leftrightarrow c(s) \cdot d(s)$. By construction, $d(A_h) \cdot d(s)$ unless A is an adapter of Q and s is a guest port of M In this case, $d(A_h)=A_h$ and $A_h$·s but $s \neq d(s)$. By lemma 4.4, s communicates with $c(s)$. By construction, $c(s) \cdot d(s)$. Similarly, either $d(A_h') \cdot d(s')$ or $d(A_h')$. $s' \leftrightarrow c(s') d(s')$. By induction hypothesis, $d(s)$ communicates with $d(s)$, so $d(A_h)$ is directly connected to $d(A_h')$. Since this argument holds for all host labels h, $d(A_g)$ communicates with $d(A'_g)$ in $N_l$.

Now suppose $p \leftrightarrow p'$ in $M_{\circ \phi}Q$ in more than one step, $p=p_o \leftrightarrow p_1 \ldots p_{n-1} \leftrightarrow p_n=p'$. Consider the sequence obtained by replacing each peak $p_i \ldots p_j$, of M as follows:

full peak:
$\ldots \leftrightarrow p_i \cdot p_{i+1} \ldots p_{j-1} \cdot p_j \leftrightarrow \ldots$ with $\ldots \leftrightarrow d(p_i) \; c(p_j)$
$\leftrightarrow c(p_j) \cdot d(p_j) \leftrightarrow \ldots$ half peak:
$\ldots \leftrightarrow p_i \cdot p_{i+1} \ldots p_{j-1} \cdot p_j \ldots$ with $\ldots \leftrightarrow +d(p_i) \cdot c(p_i) \leftrightarrow (p_j) \cdot \ldots$ link peak:
$\ldots \cdot p_i \leftrightarrow p_{i+1} \ldots p_{j-1} \leftrightarrow p_j \ldots$ with $\ldots \cdot p_i \leftrightarrow p_j \ldots$ The initial and final '$\leftrightarrow$' or '.' indicates the relationship of the peak sequence $p_i \ldots p_j$ with the rest of the communication sequence; in each case the substitution preserves this relationship. If $p_i$ or $p_j$ is the initial or final port in the sequence, then the corresponding '.' does not appear. There is a symmetric case for half peaks with '$\leftrightarrow$' and '.' reversed; it is also possible for a half peak that $i=j$.

The result is a sequence of ports of N, that are asserted to be related by communication or connection. Within the subsequence of ports from $d(p)$ to $d(p')$, it is submitted that all the relations hold in $N_l$. This proves the lemma.

Suppose two adjacent ports are related by connection: $a \cdot b$. The substitution introduces new connections between a port $c(p)$ and $d(p)$, some backbone port p, and this connection exists in N, by construction. Any other connection is either a connection between two private ports of Q or a connection in $\sigma$ between two public nonhost ports of Q or N; in each case the connection must exist in $N_l$.

Suppose two adjacent ports are related by communication: $a \leftrightarrow b$. If the communication was introduced by some substitution, then a and b are the test ports of some peak, so by lemma $a \leftrightarrow b$. Otherwise, the communication must be $a=d(p_i) \leftrightarrow b=d(p_{i+1})$ where $p_i \leftrightarrow p_{i+1}$ in $M_{\circ \circ}Q$. This follows from the first part of the argument.

Recall that $(Q,y,y',\sigma)$ is the assumed test of M $d(y)=y$ and $d(y')=y'$ since $y,y' \in Q$. By lemma 4.8, $y \leftrightarrow y$ in $N_{l(y)}=N_{\circ \phi}D[T(H_{l(y)})]o_{\sigma'}Q$ where $l=l(y)$. By proposition 3.6, $y \leftrightarrow y$ in $N_{\circ \circ}Q$.

Theorem 4.9 Let M and N be networks. There is an algorithm that decides if $M \leq N$ in time $O(|M|(|M|+|N|))$.||

Compute nf(M). For each basic test $(C_k, a, b, w)$ of M, decide if $a \leftrightarrow b$ in $C_k o_w N$. By theorem 4.6, $M \leq N$ exactly if N satisfies all such basic tests. There are $O(|M|)$ such tests, and it takes time $O(|N|+|M|)$ to test if a pair of ports communicate.

Figure 10:
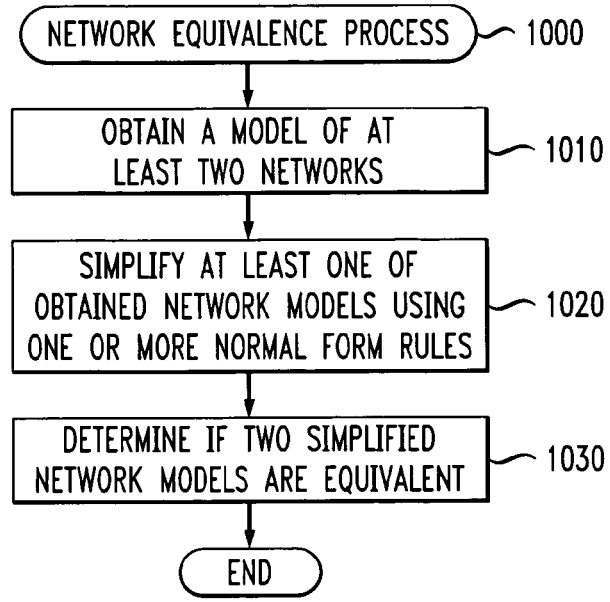
FIG. 10 is a flow chart describing an exemplary implementation of a network equivalence process incorporating features of the present invention.

FIG. 10 is a flow chart describing an exemplary implementation of a network equivalence process 1000 incorporating features of the present invention. As shown in FIG. 10, the network equivalence process 1000 initially obtains a model of at least two networks during step 1010. The model may be, for example, generated using NetML. The network equivalence process 1000 then simplifies at least one of the obtained network models during step 1020 using one or more normal form rules.

Finally, the network equivalence process 1000 determines if the two simplified network models are equivalent during step 1030. For example, the network equivalence process 1000 can test if the two simplified network models are isomorphic.

While FIG. 10 shows an example of the sequence of steps, it is also an embodiment of the present invention that the sequence may be varied. Various permutations of the algorithm are contemplated as alternate embodiments of the invention.

Figure 11:
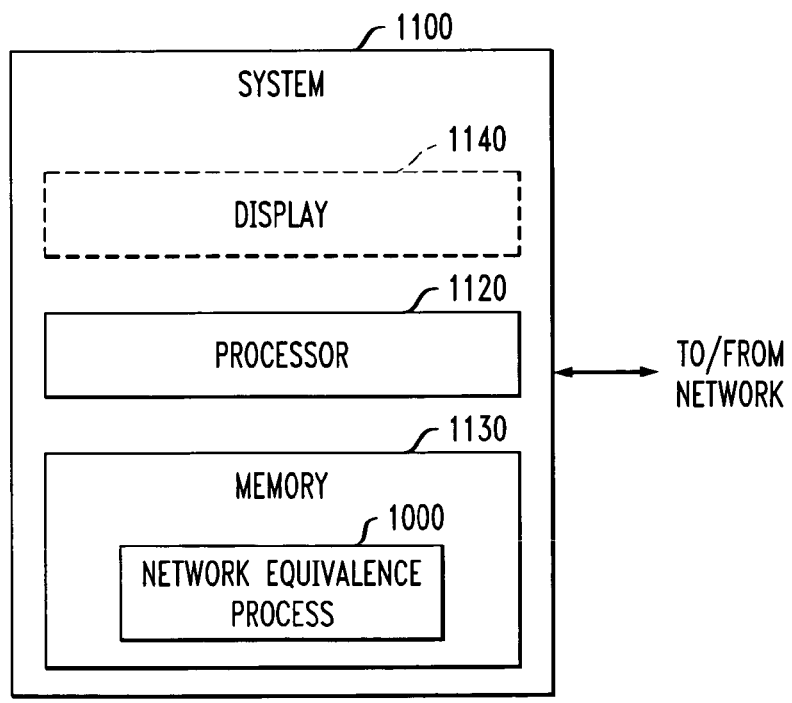
FIG. 11 is a schematic block diagram of an exemplary computing system that implements the network equivalence process of FIG. 10.

FIG. 11 is a schematic block diagram of an exemplary computing system that implements the network equivalence process of FIG. 10. As shown in FIG. 11, memory 1130 configures the processor 1120 to implement the network equivalence methods, steps, and functions disclosed herein (collectively, shown as 1000 in FIG. 11). The memory 1130 could be distributed or local and the processor 1120 could be distributed or singular. The memory 1130 could be implemented as an electrical, magnetic or optical memory, or any combination of these or other types of storage devices. It should be noted that each distributed processor that makes up processor 1120 generally contains its own addressable memory space. It should also be noted that some or all of computer system 1100 can be incorporated into an application-specific or general-use integrated circuit.

System and Article of Manufacture Details

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, memory cards, semiconductor devices, chips, application specific integrated circuits (ASICs)) or may be a transmission medium (e.g., a network comprising fiber-optics, the worldwide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

I claim:

1. A method for determining whether two networks are equivalent, the method performed by a processor and comprising the steps of:
    obtaining a network model for each of at least two networks;
    transforming, with use of the processor, at least one of the obtained network models to a transformed network model using one or more normal form rules, wherein said at least one transformed network model has a reduced number of network elements in comparison to the corresponding obtained network model; and
    determining if any two or more of said obtained network models and said at least one transformed network model are equivalent.

2. The method of claim 1, wherein said network model is generated using NetML.

3. The method of claim 1, wherein said determining step further comprises the step of determining if any two or more of said obtained network models and said at least one transformed network model are isomorphic.

4. The method of claim 1, wherein said determining step further comprises the step of determining if two networks M and N are equivalent by performing the following steps:
    forming the basic tests of M;
    determine if each basic test of M is satisfied by N;
    repeating said forming and determining steps with the roles of M and N reversed; and determining that networks M and N are equivalent if all basic tests are satisfied.

5. The method of claim 4, further comprising the step of determining that networks M and N are inequivalent if any basic test fails.

6. The method of claim 1, wherein said at least one of the obtained network models, M, contains a link l with ports p and q, at least one of which is not public, wherein connection p·p' connects port p to port p' and wherein connection q·q' connects port q to port q', and wherein said one or more normal form rules delete said link l, said connection p·p' and said connection q·q', and add a connection p'·q'.

7. The method of claim 6, wherein if a first one of said ports, p or q, is public, and the second one of said ports, p or q, is connected to a port p', then in addition p' is deleted and replaced by said first port.

8. The method of claim 1, wherein said at least one of the obtained network models, M, contains a pair of adapters A and B with connected host ports, and wherein said one or more normal form rules delete adapters A and B.

9. The method of claim 8, wherein if said adapters A and B had the same type, then for each guest label g so that A and B both have a port with label g, $A_g$ and $B_g$ become the end ports of a new link.

10. The method of claim 1, wherein said one or more normal form rules delete a port p that is free and not public.

11. The method of claim 10, wherein if p is an end port of a link, then the link is deleted.

12. The method of claim 10, wherein if p is a host port or the last guest port of an adapter, then the adapter is deleted.

13. The method of claim 1, wherein said one or more normal form rules delete a port p if it is isolated and not public.

14. The method of claim 1, wherein at least one of said network models includes link port data for one or more physical links.

15. The method of claim 1, wherein at least one of said network models includes one or more of adapter port status or adapter port label for one or more adapter ports.

16. The method of claim 1, wherein a first network M is generalized by a second network N, M≦N, if every test that satisfies M also satisfies N.

17. The method of claim 1, wherein a first network M is equivalent to a second network N, N≡M, if M generalizes N and N generalizes M.

18. A system for determining whether two networks are equivalent, comprising:
a memory; and
at least one processor, coupled to the memory, operative to:
obtain a network model for each of at least two networks;
transform at least one of the obtained network models to a transformed network model using one or more normal form rules, wherein said at least one transformed network model has a reduced number of network elements in comparison to the corresponding obtained network model; and
determine if any two or more of said obtained network models and said at least one transformed network model are equivalent.

19. The system of claim 18, wherein said determining step further comprises the step of determining if any two or more of said obtained network models and said at least one transformed network model are isomorphic.

20. An article of manufacture for determining whether two networks are equivalent, comprising a machine readable recordable medium containing one or more programs that when executed by a processor implement the steps of:
obtaining a network model for each of at least two networks;
transforming, with use of the processor, at least one of the obtained network models to a transformed network model using one or more normal form rules, wherein said at least one transformed network model has a reduced number of network elements in comparison to the corresponding obtained network model; and
determining if any two or more of said obtained network models and said at least one transformed network model are equivalent.

* * * * *

UNITED STATES PATENT AND TRADEMARK OFFICE
CERTIFICATE OF CORRECTION

| | | |
|---|---|---|
| PATENT NO. | : 7,848,254 B2 | Page 1 of 1 |
| APPLICATION NO. | : 11/281642 | |
| DATED | : December 7, 2010 | |
| INVENTOR(S) | : Steven J. Fortune | |

It is certified that error appears in the above-identified patent and that said Letters Patent is hereby corrected as shown below:

In column 10, line 53, "Define a" should be replaced by -- Define $\sigma$ --.

In column 17, line 50, "a↔in" should be replaced by -- a↔$a'_{in}$ --.

In column 18, line 22, "...$p_{j-1}$ • $_{pj}$" should be replaced by -- ...$p_{j-1}$ • $p_j$ --.

Signed and Sealed this

Twenty-second Day of January, 2013

David J. Kappos
*Director of the United States Patent and Trademark Office*